United States Patent [19]

Kuhn et al.

[11] 3,953,941
[45] May 4, 1976

[54] METHOD AND APPARATUS FOR MAKING A GROOVE IN A SEMI-CONDUCTOR ELEMENT

[75] Inventors: Otto Kuhn, Lupfig; Samuel Schweitzer, Birr, both of Switzerland

[73] Assignee: BBC Brown Boveri & Company Limited, Baden, Switzerland

[22] Filed: Oct. 11, 1974

[21] Appl. No.: 514,251

[30] Foreign Application Priority Data
Oct. 11, 1973 Switzerland............... 14509/73

[52] U.S. Cl.................. 51/15 R; 51/8 R; 51/319
[51] Int. Cl.².............. B24C 1/04; B24C 3/22
[58] Field of Search............. 51/8 R, 14, 15 R, 319, 51/320, 321

[56] References Cited
UNITED STATES PATENTS

| | | | |
|---|---|---|---|
| 3,262,234 | 7/1966 | Roach | 51/15 X |
| 3,570,195 | 3/1971 | Otsuka | 51/320 |
| 3,589,081 | 6/1971 | Kilischenko | 51/319 |
| 3,694,972 | 10/1972 | Emeis | 51/319 |
| 3,824,737 | 7/1974 | Janson | 51/8 |

*Primary Examiner*—Al Lawrence Smith
*Assistant Examiner*—Nicholas P. Godici
*Attorney, Agent, or Firm*—Oblon, Fisher, Spivak, McClelland & Maier

[57] ABSTRACT

A method and apparatus for forming a groove in a semiconductor element with at least two junctions between regions of alternating opposite conduction types and different doping concentrations and with the semiconducting region enclosed between the junctions exhibiting a higher resistivity than either of the neighboring regions, the lateral surface of the element between the surface edges of the junctions being sloped by means of a groove cut by sand blasting.

6 Claims, 3 Drawing Figures

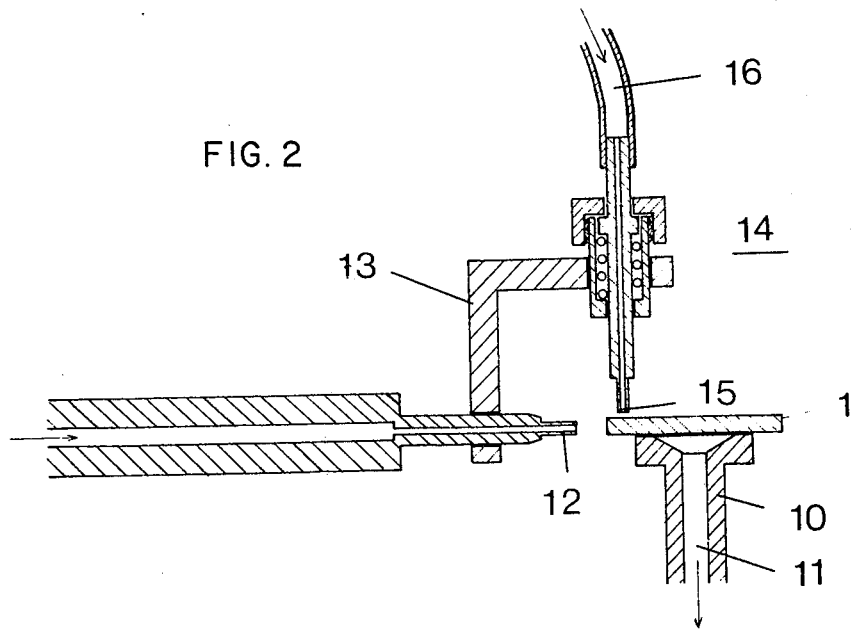
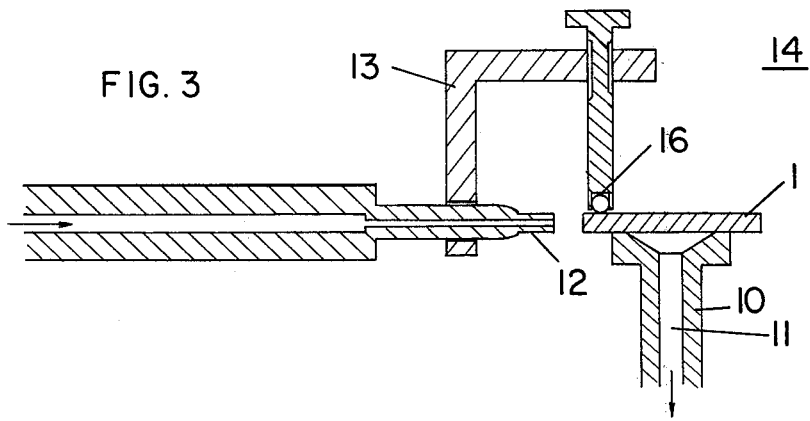

METHOD AND APPARATUS FOR MAKING A GROOVE IN A SEMI-CONDUCTOR ELEMENT

BACKGROUND OF THE INVENTION

1. Field of the Invention:

The present invention relates to a method and apparatus for making a semiconductor element and more particularly to a method and apparatus for making a semiconductor element with at least two junctions between regions of alternating opposite conduction types and different doping concentrations, and with the semiconducting regions enclosed between the junctions exhibiting a higher resistivity then either of the neighboring regions.

2. Description of the Prior Art:

Known semiconductor components with several PN junctions, e.g., thyristors, designed for high off-stage voltages in the range of a few kilovolts, have various fundamental drawbacks. Although known elements of this type, judging from their dimensions, could bear relatively high transient or steady off-state voltages, they must be operated at lower off-state voltages for reasons of safety. The reason is that premature voltage breakdowns are to be expected in the region of the surface edge of the junction. The instabilities to be expected frequently derive from the fact that the state of the semiconductor surface changes with time. The surface off-state currents resulting from voltage peaks are concentrated in a few microscopically small fissures. These fissures usually appear only at the surface edge of the junction. In such a narrow zone, however, the production of heat can be so concentrated as to cause melting, regardless of the size of the semiconductor element, and the destruction of the ability of the element to withstand off-state voltage. That voltage at which the blocking junction loses its high impedance is designated as its breakdown voltage in the blocking direction. From the Swiss Patent No. 414,866, it is known how to avoid such breakdowns by sloping the semiconductor surface between two neighboring junctions by means of a groove. The sand jet method proposed for making the groove seldom is successful, however, because the groove generally cannot be maintained truly parallel to the PN-junctions.

SUMMARY OF THE INVENTION

It is therefore an object of the present invention to so improve the prior art method that, with simple means, semiconductor elements can be produced which permit operation with higher off-state voltages than do known elements of this type and for which the surface losses can be kept relatively low. The foregoing and other objects are achieved by having a sandblast nozzle opposite the surface of the semiconductor automatically guided parallel to the junctions, while relative motion between the semiconductor and the sandblast nozzle is produced. In this way, grooves of uniform structure and dimensions can be made reproducibly. Also important is the attainment of a significant reduction in the rejection rate during manufacture of semiconductor elements, with, in addition, a more uniform quality in these elements than before.

BRIEF DESCRIPTION OF THE DRAWINGS

A more complete appreciation of the present invention will be readily obtained as the same becomes better understood by reference to the following detailed description when considered in connection with the accompanying drawings, wherein:

FIG. 2 is a cross-sectional view of an arrangement for production of semiconductor elements as in FIG. 1; and FIG. 3 is a view similar to that of FIG. 2 showing another embodiment of the present invention.

DESCRIPTION OF THE PREFERRED EMBODIMENTS

Figure 1:
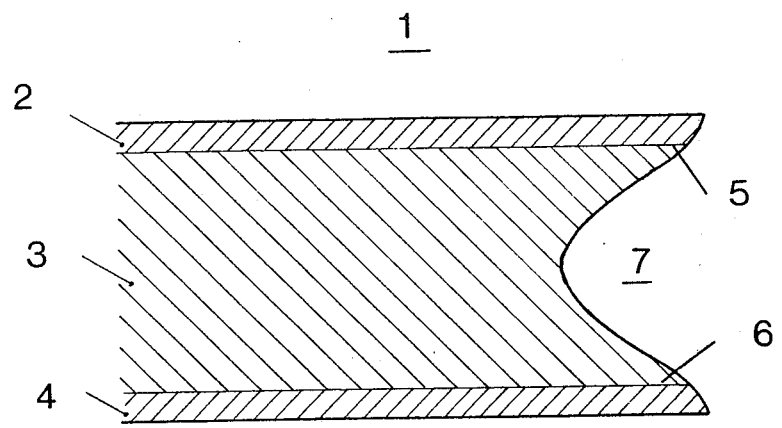
FIG. 1 is a cross-sectional view of a semiconductor element with a groove between two PN-junctions.

As shown in FIG. 1 a semiconductor element 1 includes an upper P-zone 2, an N-zone 3 and a lower P-zone 4. The N-zone 3 has a higher resistivity than the P-zones 2 and 4. Between the upper P-region and the N-region is a PN-junction 5, while between the N-zone and the lower P-zone is a lower PN-junction 6. On its lateral surface the semiconductor element 1 has a groove 7 located symmetrically with respect to the PN-junctions 5 and 6. The groove 7 forms a so-called double positive taper. A taper is called positive when the cross-sectional area of the semiconductor element decreases in the direction from the heavily doped side of the PN-junction (lower resistivity) to the lightly doped side (higher resistivity). In the reverse case the taper is called negative.

The arrangement shown in FIG. 2 is especially adapted to the production of the semiconductor element of FIG. 1. The arrangement includes a substrate holder 10 on which the element 1, e.g. a round silicon wafer, lies. The semiconductor element 1 is fixed on the holder 10 by a vacuum, for example, in which case the substrate holder is hollow and funnel shaped at its upper end. It is connected to a vacuum pump, not shown, through suction line 11.

To the side of the substrate holder is a sandblast nozzle 12 which is directed at the lateral surface of the semiconductor element 1. By way of a nozzle holder 13, the sandblast nozzle 12 is joined to a sensing device 14 which, in the example, consists of an auxiliary nozzle 15 directed at the top surface of the semiconductor element. A constant flow of gas is supplied to the auxiliary nozzle 15 through tube 16. By the cushioning effect between the end of the auxiliary nozzle 15 and the surface of the semiconductor 1, the nozzle holder 13 and thus the sandblast nozzle 12 is held at a precisely defined distance from the surface of the semiconductor element 1. In this way it is possible reproducibly to align the sandblast nozzle 12 symmetrically with respect to the two PN-junctions 5 and 6, FIG. 1, and thus to produce a groove 7 which is always symmetrically disposed with respect to the PN-junctions.

In the example, the substrate holder 10 with the semiconductor element 1 on it, is rotated to produce a uniform groove 7 around the lateral surface of the element. The sandblast nozzle 12 is held in a definite position with surprising precision on account of the pressure difference between the gas flowing out of the auxiliary nozzle 15 and the surrounding atmosphere.

In a variation of the example described, as disclosed within FIG. 3, there can be used in place of the auxiliary nozzle 15, a mechanical guide, e.g. a feeler with a ball-roller tip 16, which contacts the top surface of the semiconductor element 1 and thus maintains the sandblast nozzle 12 at a uniform level.

With the described arrangement grooves can be produced which run uniformly parallel to the PN-junction.

The sandblast nozzle 12 provides a groove of uniform shape and depth on the rotating semiconductor element. This enables the manufacture of semiconductor elements which can safely be subjected to off-state voltages of more than 4 kv.

Conpared to a semiconductor component of conventional form having a semiconductor element of comparable size and structure, a component made in the shape described and by the described method realizes an off-state voltage capability up to 30% greater. At the same time the active surface cross section in the semiconductor element is increased so that higher currents are possible.

Obviously numerous modifications and variations of the present invention are possible in light of the above teachings. It therefore to be understood that within the scope of the appended claims the present invention may be practiced otherwise than as sepcifically described herein.

What is claimed as new and desired to be secured by Letters Patent of the United States is:

1. A method of forming a groove in a semiconductor element having at least two junctions between regions of alternating opposite conduction types and different doping concentrations, the seminconducting region enclosed between the junctions exhibiting a higher resistivity than either of the neighboring regions, the element having tapers in its lateral surface in the form of a groove symmetrically disposed between neighboring junctions where they come to the surface, the method comprising the steps of:

directing an abrasive blast from a sandblast nozzle at the semiconductor element's surface to produce said groove;

sensing the position of said nozzle relative to a single surface of said element which is parallel to said junctions of said element; and automatically guiding said nozzle, in response to said sensing, parallel to the semiconductor junctions while a relative motion between the semiconductor element and the sandblast nozzle is produced.

2. A method as set forth in claim 1, further comprising the step of rotating said semiconductor element with respect to said sandblast nozzle.

3. Apparatus for forming a groove in a semiconductor element having at least two junctions between regions of alternating opposite conduction types and different doping concentrations, the semiconductor region enclosed between the junctions exhibiting a higher resistivity than either of the neighboring regions, the element having tapers in its lateral surface in the form of a groove symmetrically disposed between neighboring junctions where they come to the surface, the apparatus comprising:

means for directing an abrasive blast from a sandblast nozzle at said semiconductor element's surface to produce said groove; and means for automatically guiding said nozzle parallel to said semiconductor junctions while a relative motion between said semiconductor element and said sandblast nozzle is produced;

said means automatically guiding said nozzle including a sensing device connected to said sandblast nozzle and operatively guided over a single surface of said semiconductor element which is parallel to said junctions of said element, whereby said nozzle is automatically guided with respect to said semiconductor junctions in response to the sensing operation of said sensing device.

4. Apparatus as set forth in claim 3, wherein said sensing device comprises an auxiliary nozzle which is supplied with a constant flow of gas.

5. Apparatus as in claim 3, wherein said sensing device is in the form of a mechanical feeler.

6. Apparatus as set forth in claim 3, wherein said semiconductor element is rotatable about its symmetry axis, on a substrate holder with respect to said nonrotating sandblast nozzle.

* * * * *